(12) United States Patent
Vogelsang et al.

(10) Patent No.: US 11,029,216 B1
(45) Date of Patent: *Jun. 8, 2021

(54) IC WITH STRAGICALLY BIASED DIGITAL CIRCUITRY

(71) Applicant: Rambus Inc., Sunnyvale, CA (US)

(72) Inventors: Thomas Vogelsang, Mountain View, CA (US); Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/528,496

(22) Filed: Jul. 31, 2019

Related U.S. Application Data

(63) Continuation of application No. 15/794,280, filed on Oct. 26, 2017, now Pat. No. 10,378,967.

(60) Provisional application No. 62/413,864, filed on Oct. 27, 2016, provisional application No. 62/507,104, filed on May 16, 2017.

(51) Int. Cl.
*H03K 19/0175* (2006.01)
*G05F 1/56* (2006.01)
*G01K 7/01* (2006.01)
*G05F 3/24* (2006.01)

(52) U.S. Cl.
CPC .............. *G01K 7/01* (2013.01); *G05F 1/562* (2013.01); *G05F 3/245* (2013.01)

(58) Field of Classification Search
CPC ............ G01K 7/01; G05F 1/562; G05F 1/245
See application file for complete search history.

(56) References Cited

U.S. PATENT DOCUMENTS

| | | | |
|---|---|---|---|
| 4,613,768 | A | 9/1986 | Pommer, II |
| 5,793,691 | A | 8/1998 | Mullarkey |
| 6,777,978 | B2 | 8/2004 | Hart et al. |
| 7,045,830 | B1* | 5/2006 | Cai ................... H01L 29/7391 |
| | | | 257/139 |
| 7,289,374 | B2 | 10/2007 | Partsch |
| 7,307,471 | B2 | 12/2007 | Gammie et al. |
| 7,342,291 | B2 | 3/2008 | Vogelsang |
| 8,657,489 | B2 | 2/2014 | Ladurner et al. |
| 8,816,754 | B1 | 8/2014 | Clark et al. |
| 9,646,679 | B2* | 5/2017 | Kamohara ............. G11C 5/146 |
| 2007/0019489 | A1 | 1/2007 | Herbert et al. |
| 2009/0237135 | A1 | 9/2009 | Ramaraju et al. |
| 2010/0327951 | A1 | 12/2010 | Fukuoka |
| 2015/0171854 | A1 | 6/2015 | Yoshimoto et al. |

* cited by examiner

*Primary Examiner* — Dinh T Le
(74) *Attorney, Agent, or Firm* — Charles Shemwell

(57) ABSTRACT

During operation of an IC component within a first range of temperatures, a first bias voltage is applied to a first substrate region disposed adjacent a first plurality of transistors to effect a first threshold voltage for the first plurality of transistors. During operation of the IC component within a second range of temperatures that is distinct from and lower than the first range of temperatures, a second bias voltage is applied to the first substrate region to effect a second threshold voltage for the first plurality of transistors that is at least as low as the first threshold voltage.

20 Claims, 2 Drawing Sheets

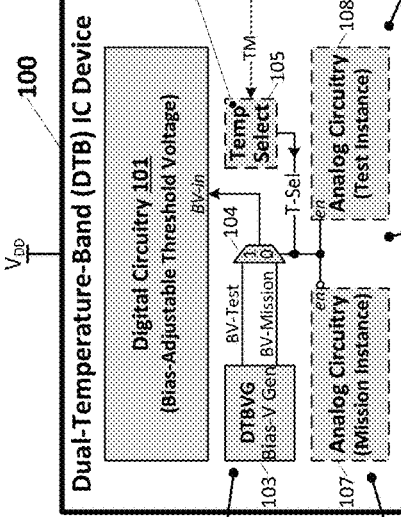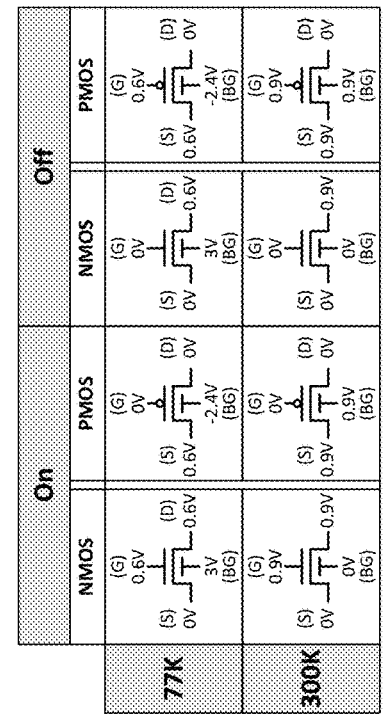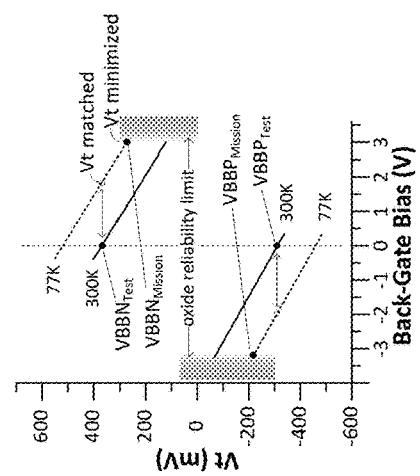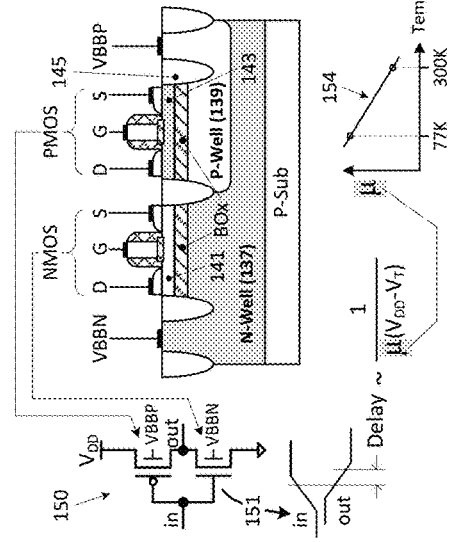

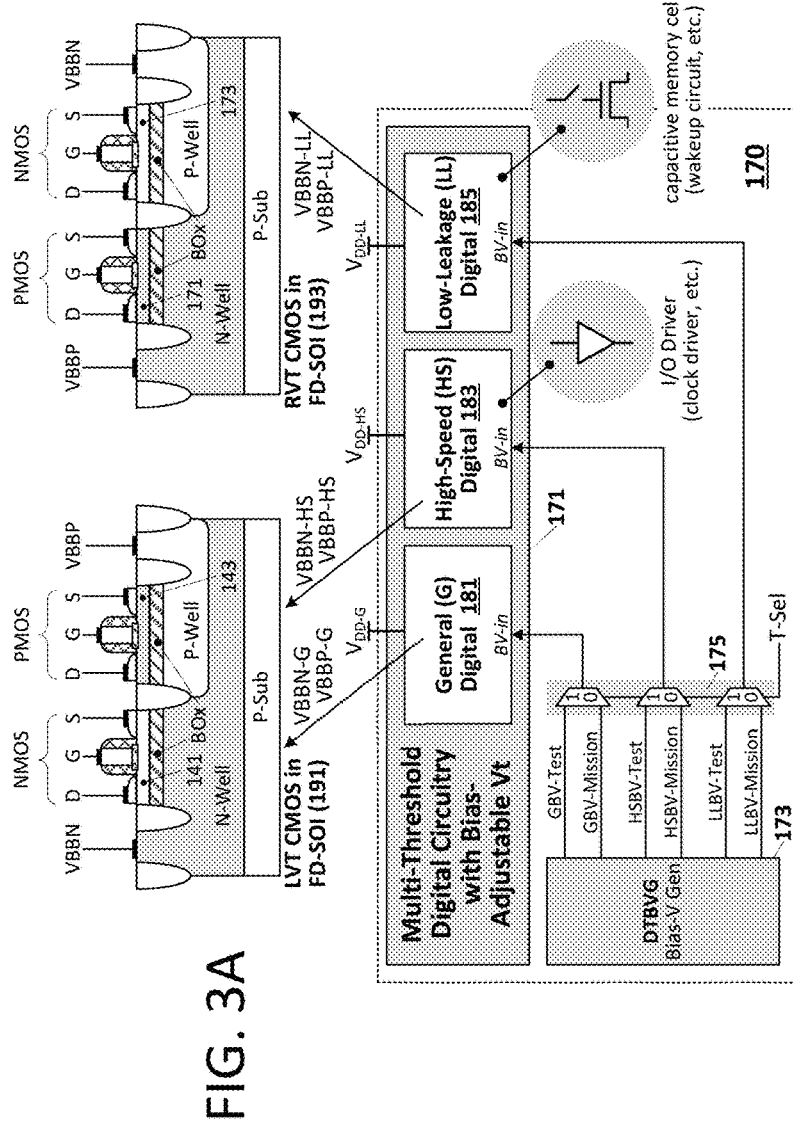
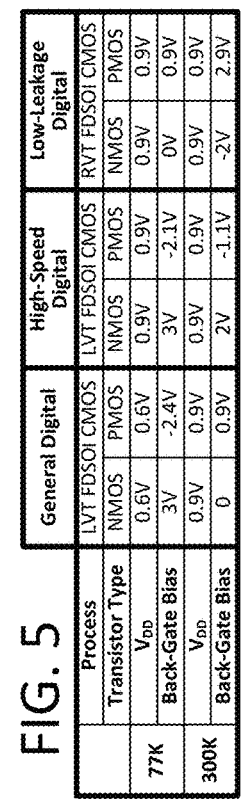
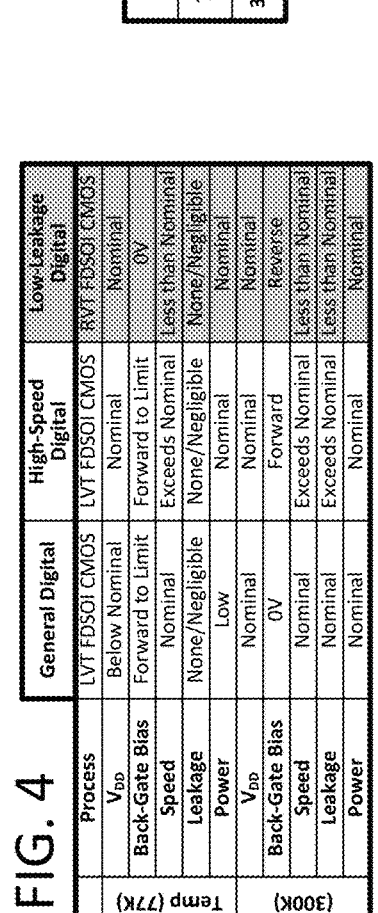

US 11,029,216 B1

IC WITH STRAGICALLY BIASED DIGITAL CIRCUITRY

CROSS REFERENCE TO RELATED APPLICATIONS

This application is a continuation of U.S. patent application Ser. No. 15/794,280 filed Oct. 27, 2017 (now U.S. Pat. No. 10,378,967), which claims the benefit of (i) U.S. provisional patent application No. 62/413,864 filed Oct. 27, 2016 and (ii) U.S. provisional patent application No. 62/507,104 filed May 16, 2017. Each of the foregoing patent applications is hereby incorporated by reference.

TECHNICAL FIELD

The present disclosure relates to integrated circuit device implementation and operation.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a CMOS IC device operable in both a cryogenic mission-mode environment and a room-temperature test environment;

FIG. 2A illustrates an exemplary cross-section of a CMOS transistor pair implemented in a low-threshold-voltage fully-depleted silicon-on-insulator process (LVT FD-SOI);

FIG. 2B illustrates exemplary back-gate biasing applied within the LVT FD-SOI structure of FIG. 2A to yield delay-matched operation at distinct mission and test temperature points;

FIG. 2C illustrates an exemplary set of source, drain and back-gate-bias voltages for operation of the NMOS and PMOS transistors of FIG. 2A at both 77K and 300K, showing also different gate voltages applied to yield "on" and "off" transistor states;

FIG. 3A illustrates an alternative dual-temperature-band IC embodiment having multi-threshold digital circuitry in which different performance metrics are optimized respective classes of digital circuits;

FIG. 3B depicts exemplary mission-temperature, test-temperature and equalized-threshold bias points on a plot of threshold voltage versus back-gate-bias voltage for both the low-threshold-voltage (LVT) and regular-threshold-voltage (RVT) NMOS and PMOS transistors shown in FIG. 3A;

FIG. 4 is an exemplary tabulation of different process implementations and supply/bias voltages within the embodiment of FIG. 3A, showing relative switching speed, leakage and power characteristics for both cryogenic mission and room-temperature test environments;

FIG. 5 illustrates an exemplary set of supply voltages and back-gate bias voltages applicable to the general, high-speed and low-leakage digital circuit classes shown in FIG. 3A at cryogenic-mission and room temperatures.

DETAILED DESCRIPTION

Integrated circuit (IC) devices that operate with bias-matched digital delay characteristics in at least two distinct temperature ranges are disclosed herein in various embodiments. While the distinct temperature ranges described below generally include a test temperature range centered at nominal room temperature (e.g., 300K±27K) and a cryogenic mission temperature range centered at or near the boiling point of liquid nitrogen (e.g., 77K±2K), different or additional temperature ranges may be spanned in all cases and the size/center-point of the room-temperature and/or mission temperature ranges may vary. To provide for bias-controlled digital (elemental) delay with fixed run-time supply voltages, various CMOS (complementary metal oxide semiconductor) integrated circuit embodiments are fabricated in silicon-on-insulator (SOI) substrates that permit bias voltages to be applied to the body-side of the insulator layer and thus vary the threshold voltage of device layer transistor circuitry. More specifically, to achieve matched transistor delay in both the test and mission temperature environments—environments characterized by dramatically different threshold voltages and carrier mobilities between room and cryogenic temperatures—without sacrificing low-temperature power savings or compromising circuit operability, bias voltages applied to respective body-side substrate wells adjacent NMOS and PMOS transistors are shifted upon transition from one temperature domain to the other, adjusting transistor threshold voltages in a direction that counters the threshold voltage changes at a given supply voltage. In a number of embodiments detailed below, fully depleted SOI (FD-SOI) substrates are employed to fabricate CMOS circuits with bias-adjustable threshold voltages—structures having body-side doping to form N-wells and P-wells and a buried oxide (insulator) layer that permits application of "back-bias" voltages to those body-side wells to effect bias-shifted threshold voltages. Other types of substrates may be used in alternative embodiments (generally with attendant change in bias voltage and/or supply voltage set points), including partially-depleted SOT substrates or any other substrate in which the CMOS transistor channels are conductively isolated from voltage-bias-capable regions within the substrate body.

In general, minimizing CMOS transistor threshold voltage (Vt) permits a correspondingly minimized supply voltage in view of design-target elemental delay (i.e., delay $\sim 1/(V_{DD}-Vt)$) and thus a quadratically reduced operating power consumption ($P_{OP} \sim V_{DD}^2$). Moreover, the intrinsically high subthreshold slope at a 77K mission temperature enables device fabrication in a process with a threshold voltage substantially lower than would be possible at a higher mission temperature. For example, a nominal subthreshold slope of 25 mV/decade at 77K and a design-target leakage ($I_{0V}$) current five orders of magnitude lower than the current at threshold (i.e., $\log_{10}(I_{Vt}/I_{0V})=5$) enables fabrication in a CMOS process that yields a 125 mV threshold voltage (5*25 mV) at 77K. Because the threshold voltage for a given CMOS process declines as temperature rises, however, transistors implemented in such a 77K-optimized process will have a significantly reduced threshold voltage at room temperature and thus will generally leak to the point of being non-functional in a room-temperature test environment. For example, assuming a 150 mV threshold-voltage drop from 77K to 300K, transistors having a 125 mV threshold voltage at 77K will have a threshold voltage at or below 0 mV at room temperature and thus will leak profusely (i.e., as though held permanently in an on state), rendering circuitry constituted with such transistors non-functional and therefore non-testable at room temperature.

FIG. 1 illustrates an exemplary fabrication/architecture of a CMOS IC device 100 operable in both a cryogenic mission environment (e.g., 77K) and a room temperature test environment (e.g., 300K)—an IC device referred to herein as a dual-temperature-band IC. As shown at 115, IC 100 is fabricated in a process that (i) meets a target elemental delay and leakage current at room temperature, with minimized threshold voltage, and (ii) enables threshold voltage to be adjusted through application of back-gate bias. That is, as explained in further detail below, bias voltages applied to oxide-isolated wells effectively shift the threshold voltage of elemental NMOS and PMOS transistors and thus enable temperature-induced changes in threshold voltage to be countered in a manner that maintains target performance (leakage current and switching speed) without sacrificing the power-reduction benefit of cryogenic operation.

Per the exemplary architectural feature list at 117, IC 100 includes digital circuitry 101 with bias-adjustable threshold voltage (e.g., back-bias wells and bias-supply contacts thereto as discussed below) and, in a number of embodiments, an on-die bias voltage generator 103 capable of generating bias voltages for each different temperature band of interest. In one embodiment, for example, IC 100 includes a dual-band bias voltage generator that generates one or more test-temperature bias voltages (B V-Test to be applied at ~300K) as well as one or more mission-temperature bias-voltages (B V-Mission to be applied at ~77K), and a selector circuit 104 that switchably interconnects one bias-voltage set or the other (mission or test) to bias voltage input(s) of the threshold-adjustable digital circuitry 101. The selector circuit 104 itself (which may be incorporated within bias generator 103) is responsive to a temperature-band-select signal (T-Sel) which may be generated by an on-chip temperature sensor or supplied from either an on-chip programmable circuit (e.g., non-volatile memory or register having one or more temperature-band-select bits programmed therein) or off-chip select-signal source. In one implementation, shown for example in detail view 110, an on-chip temperature select circuit 105 having both a temperature sensor 125 and a multiplexer/selector circuit 127 to enable either the temperature sensor output or an externally received (via buffer 129) or programmatically stored mode signal (TM) to drive the temperature select signal. Multiplexer/selector 129 may itself be controlled by a signal supplied from an on-chip programmable circuit or from a source external to IC 100.

In embodiments that include temperature-sensitive analog circuitry, IC 100 may include dual instances of the analog circuitry—a mission instance 107 designed and/or calibrated for operation at a mission temperature, and a test instance 108 designed/calibrated for operation in a room temperature test environment. In the depicted embodiment, the temperature-select signal is provided to respective enable inputs of the counterpart analog circuit instances, with either the mission or test instance analog circuitry having an inverting enable input so that T-Sel enables operation of one analog circuitry instance in a high logic state and the other instance in a low logic state. In the mission-mode, in particular, the counterpart test-instance analog circuitry may be rendered to a disabled un-powered state to avoid wasted power/heat generation in the cryogenic temperature domain. The mission-mode analog circuitry may similarly be rendered to a low power state when disabled.

To enable operation in a room-temperature test environment (119), dual-temperature bias-voltage generator 103 (DTBVG) is set to render back-bias voltages to digital circuitry 101 at predetermined room temperature setpoints, and an operating voltage ($V_{DD}$) is supplied at a voltage level that yields the gate overdrive potential for the target delay (switching speed). When deployed for operation in a cryogenic temperature domain (mission deployment 121), dual-temperature bias voltage generator 103 is set to render back-bias voltages to digital circuitry 101 at predetermined cryogenic setpoints generally chosen to reduce the cryo-temperature threshold voltage as low as possible without exceeding oxide reliability limits (as discussed below) and/or cryo-temperature leakage target. The cryo-temperature leakage target may be chosen, for example, to match the room temperature leakage target or to have a predetermined ratio with respect to the room temperature leakage target (e.g., cryo-temperature leakage target set an order of magnitude below the room temperature leakage target). In any case, the operating voltage supplied during cryogenic mission operation may be set to match the room temperature delay target—generally a supply voltage level 20-30% lower (or more) than the room-temperature supply voltage, roughly cutting operating power consumption in half (or more) upon mission deployment.

FIG. 2A illustrates an exemplary cross-section of a CMOS transistor pair (an NMOS device and a PMOS device) implemented in a low-threshold-voltage (LVT) FD-SOI process, and FIG. 2B illustrates exemplary back-gate biasing applied within the LVT FD-SOI structure to yield delay-matched operation at distinct mission and test temperature points. In the depicted example, the NMOS and PMOS transistor channels are electrically isolated (conductively isolated—no carrier conduction) from N-Well 137 and P-well 139, respectively, by a buried oxide layer ("BOx")— the insulator layer or dielectric layer within the fully-depleted silicon-on-insulator substrate. Structures 145 (e.g., shallow-trench isolation (STI) structures, etc.) serve to laterally isolate the transistor structures from each other and from surface exposures of wells 137 and 139. Because the NMOS and PMOS transistors are implemented in wells having a carrier predominance opposite that of a conventional bulk technology, the LVT FDSOI arrangement is referred to herein as a flipped-well implementation.

Being disposed opposite the oxide layer from NMOS transistor channel formation region 141, N-well 137 effectively acts as a second control gate or "back gate" that may be used to adjust the threshold voltage—the NMOS gate-to-source voltage (i.e., potential between gate and source terminals, G and S) needed to effect a conducting channel in region 141 between the NMOS source and drain terminals (S and D). More specifically, application of a voltage at terminal VBBN more positive than the NMOS source voltage reduces the threshold voltage of the NMOS transistor and, similarly, application of a voltage at terminal VBBP more negative than the PMOS source voltage reduces (makes less negative) the PMOS threshold voltage—i.e., reduces the magnitude of the gate-to-source voltage required to form a conducting channel between the source and drain terminals of the PMOS transistor.

Still referring to FIG. 2A and assuming that the NMOS and PMOS transistors are interconnected as shown at 150 to form an inverter circuit (NMOS source grounded, PMOS source coupled to VDD), then a transition at the inverter input will yield a corresponding and oppositely-directed transition at the inverter output after an elemental delay—a delay time interval that constitutes a fundamental performance metric with respect to digital circuits implemented by various interconnections of CMOS transistors. As shown at 151, the delay is approximately inversely proportional to the product of the carrier mobility ($\mu$) and the gate-overdrive voltage, the latter being the difference between the operating supply voltage and the transistor threshold (i.e., $V_{DD}$–Vt) and thus a measure of how "hard" the transistor is turned on. As shown at 154, carrier mobility itself is inversely proportional to temperature (higher mobility at lower temperature).

As discussed above, intrinsic threshold voltage in a nominal CMOS process is inversely proportional to temperature (e.g., Vt goes up by approximately 150 mV in the transition from 300K to 77K). This increased threshold voltage reduces the gate overdrive and counters the effect of the increased mobility on elemental delay. Elemental delay at low temperature might therefore be close to the elemental delay at room temperature if the operating voltage is the same. There is however no power benefit with an unchanged operating voltage. To reduce power, the operating voltage needs to be lowered and this is made possible by lowering the threshold voltage at low temperatures so that gate overdrive can be set for equivalent elemental delay at a reduced operating voltage. FIG. 2B illustrates such a biasing scheme, for both the NMOS and PMOS transistors shown in FIG. 2A. More specifically, referring to the 300K and 77K back-gate-bias versus threshold voltage curves for the NMOS transistor (the two approximately linear curves in the positive threshold voltage range at the upper portion of diagram 2B), it can be seen that application of ~2 v at back-gate bias input VBBN in a 77K mission environment will yield roughly the same threshold voltage as the a 0 v bias at 300K. That is, assuming that a leakage current/elemental delay target at 300K is achieved in an FDSOI process that exhibits the roughly 380 mV threshold voltage shown, that same threshold voltage may be achieved at 77K through application of the ~2 v back-gate bias. At this "Vt matched" point, the roughly doubled carrier mobility at 77K (relative to 300K) allows the gate overdrive voltage to be cut approximately in half in mission mode, meaning that a 900 mV $V_{DD}$ supply at 300K (overdrive voltage=900 mV-380 mV=520 mV) may be reduced by 520 mV/2 (or 260 mV) to a VDD of 640 mV, thereby reducing operating power by a factor of ~2. (i.e., $0.900^2/0.640^2$). Further, the steep rise in subthreshold slope upon transition from 300K to 77K (e.g., on the order of 80 mV/decade at 300K to 25 mV/decade at 77K for a nominal FDSOI process) means that, at the matched-Vt bias point (i.e., 2V back-gate-bias at 77K, 0V back-gate-bias at 300K), the 77K threshold-current/leakage-current ratio is many orders of magnitude higher than the target ratio chosen for 300K (e.g., if $I_{Vt}/I_{0V}=10^5$ at 300K, then $I_{Vt}/I_{0V}$ will be approximately $10^{5*(80/25)}=\sim 10^{15}$). Thus, from a leakage current perspective, there is ample headroom for further bias-effected Vt reduction. As $V_{DD}$ will decrease proportionally with Vt (i.e., to maintain the same gate overdrive voltage), further reduction of the threshold voltage (i.e., through increase in the back-gate bias voltage applied at VBBN) enables a corresponding reduction in $V_{DD}$ and thus an exponential reduction in operating power. In FIG. 2B, for example, the back-gate-bias voltage is extended to the theoretical reliability limit of the buried oxide layer ("BOx" within FIG. 2A) and thus ~3 v in this example—a bias point that reduces Vt by approximately 100 mV relative to the test-mode Vt (i.e., from ~380 mV to ~280 mV) and thereby enables a corresponding ~100 mV reduction in $V_{DD}$. Continuing with the example above (i.e., 260 mV mission-mode overdrive voltage, 900 mV test-mode operating voltage), the operating power is reduced by a factor of approximately 2.8 ($0.900^2/0.540^2$). In cases where the oxide reliability limit permits higher back-gate bias voltages to be applied, the mission-mode threshold voltage may be lowered to a level that approaches the room-temperature target threshold/leakage current ratio—down to 125 mV in the example above (current at threshold is five orders of magnitude above target leakage current, and subthreshold slope is 25 mV/decade at 77K), or some tolerance factor above that ratio (e.g., six orders of magnitude above leakage current and thus 150 mV Vt at 25 mV/decade).

Still referring to FIGS. 2A and 2B, the PMOS transistor is back-biased at the 77K mission temperature with approximately the same 3V potential as the NMOS transistor, though with reversed polarity (i.e., -3V) in view of the reversed carrier polarity. More generally, because NMOS and PMOS transistors do not perform identically (e.g., may have different bias-voltage-to-Vt dependence, different oxide reliability limits, different mobility-temperature dependence, etc.), NMOS and PMOS back-gate-bias magnitudes may be different from one another at any or all operating temperature points. Also, because the source terminals of the NMOS and PMOS transistors are generally coupled to ground and supply rails, respectively, meaning that equal-magnitude NMOS and PMOS back-gat bias voltages—which are measured between the back-gate well (141 or 143) and source terminals of a given transistor—will generally not have the same magnitude with respect to ground. For example, assuming a 0.6V supply voltage (and PMOS source potential) at 77K, then a -3V PMOS back-gate bias voltage is achieved by applying -2.4V to P-well 139 via terminal "VBBP." By contrast, to achieve the same-magnitude (but opposite polarity) 3V back-gate bias voltage with respect to a grounded-source NMOS transistor, +3V is applied to N-well region 137 via terminal "VBBN." FIG. 2C illustrates these source, drain and back-gate voltages for NMOS and PMOS transistors at both 77K and 300K, and also shows the different gate voltages applied to yield "on" and "off" transistor states. In some embodiments both NMOS and PMOS back gate bias at room temperature are 0V. In that case the PMOS back-gate bias as referenced to source is negative at room temperature. In that case the back-gate bias of the PMOS at cryogenic temperature would be even more negative with respect to source to implement the compensation of the elemental delay and optimize for power.

FIG. 3A illustrates an alternative dual-temperature-band IC embodiment 170 having multi-threshold digital circuitry 171 in which different performance metrics are optimized respective classes of digital circuits. More specifically, in addition to generalized digital circuitry 181 (e.g., where standby power/leakage is balanced with switching speed), multi-threshold digital circuitry 171 also includes high-speed digital circuitry 183 and/or low-leakage (low standby power) digital circuitry 185. As compared to general digital circuitry 181, elemental delay within high-speed digital circuitry 183 is reduced through increased gate-overdrive voltage (i.e., reduced Vt and/or increased $V_{DD}$) at the cost of higher operating and/or standby power. The opposite is generally true in low-leakage digital circuitry 185—elemental delay is sacrificed/increased in return for lower leakage (higher Vt) and thus lower standby power consumption.

In one embodiment, high-speed digital circuitry 183 (e.g., I/O driver, clock driver, etc.) is implemented in the same LVT FD-SOI CMOS (191) process as general digital circuitry 181, with increased overdrive effected through a combination of reduced threshold voltage and higher operating voltage in each operating temperature band. Thus, $V_{DD-HS}$ is set to a higher potential than $V_{DD-G}$ in both mission and testing environments, and the temperature-specific back-gate-bias voltages supplied to the high-speed digital circuitry (by on-chip or off-chip back-gate bias voltage generator 173) are likewise set to a higher magnitude than those supplied to the general digital circuitry in both test and mission environments (i.e., |HSBV-Test|>|GBV-Test| and |HSBV-Mission|>|GBV-Mission|). In other embodiments, particularly where the oxide reliability limit prevents increase in back-gate-bias magnitude, increased gate overdrive (and thus reduced switching delay within circuitry 183) is achieved exclusively through supply voltage increase (i.e., $V_{DD\text{-}H}S>V_{DD\text{-}G}$). In those embodiments, the same GBV-Test and GB V-mission back-bias voltages are applied to both the general digital circuitry and the high-speed digital circuitry (obviating internal generation and/or external application of distinct HSBV-Test and HSBV-Mission bias voltages).

In the FIG. 3A embodiment, the low-leakage digital circuitry (e.g., standby power/wakeup circuit, low-leakage static random access memory (SRAM) cells, capacitive memory (dynamic random access memory (DRAM)) cells, etc.) is implemented in an RVT (regular Vt) process as shown at 193 (similar to LVT FD-SOI 191, but with the back-bias N-Well and P-well structures disposed beneath PMOS and NMOS transistors, respectively, instead of the flipped-well LVT configuration). As can be seen in FIG. 3B, which depicts mission-temperature, test-temperature and same-threshold points on the threshold voltage plots (against back-bias voltage) for LVT NMOS and PMOS transistors and also for RVT NMOS and PMOS transistors, the RVT FDSOI process is characterized by an intrinsically higher threshold voltage than the LVT process at the same back-gate bias point and also by a bias polarity reversal. While the target of matching elemental delay at reduced power between test and mission temperature is the same for RVT devices as for LVT devices, the definition of the bias voltages needs to be done differently. While LVT devices allow the application of back-gate bias (positive for NMOS, negative for PMOS) to reduce threshold voltage, RVT devices allow application of back-gate bias voltages of opposite polarity (negative for NMOS, positive for PMOS) to increase threshold voltage. As for the LVT devices, the back-gate bias for RVT needs to be higher (NMOS) respectively lower (PMOS) at mission temperature to achieve the goal to have lower threshold voltage at mission temperature. Due to the reverse polarity this means that the back-gate bias is e.g. zero at mission temperature and negative (NMOS) respectively positive (PMOS) at room temperature. As with general digital circuitry 181 and high-speed digital circuitry 183, bias voltage generator 173 generates (and/or external contacts are provided to receive) any distinct mission-temperature and/or test-temperature bias voltages needed for low-leakage biasing and delivers those voltages to low-leakage digital circuitry 185 in accordance with the temperature-select signal.

FIG. 4 is an exemplary tabulation of different process implementations and supply/bias voltages within the embodiment of FIG. 3A, showing relative switching speed, leakage and power characteristics for both cryogenic mission and room-temperature test environments. As shown, the general digital and high-speed digital circuitry are implemented in LVT FDSOI CMOS processes, while the low-leakage digital circuitry is implemented in an RVT FDSOI CMOS process. In general, these process applications may be carried out within the same integrated circuit with the LVT circuitry and RVT circuitry, at least, being disposed in distinct circuit regions (which may themselves be dispersed and interleaved within available die area). To the extent that distinct bias voltages and/or supply voltages are applied to any or all of the different classes of digital circuits, different bias voltage and/or supply voltage rails are distributed to and connected to those circuit regions. Where the different bias voltages are supplied by a bias voltage source external to the integrated circuit die, the die is implemented with a respective input node (contact) coupled to receive each distinct bias voltage (with such node coupled to bias voltage conductors coupled to the corresponding digital circuit regions. Similarly, where different operating supply voltages are to be applied to any or all of the different classes of circuits (i.e., $V_{DD\text{-}G}$, $V_{DD\text{-}HS}$ and/or $V_{DD\text{-}LL}$ as depicted in FIG. 3A), the integrated circuit die is implemented with multiple supply voltage nodes, each coupled to receive a respective supply voltage input and internally coupled to the voltage supply rail for the circuitry to be powered by that supply voltage.

FIG. 5 illustrates an exemplary set of supply voltages and back-gate bias voltages applicable to the general, high-speed and low-leakage digital circuit classes shown in FIG. 3A at cryogenic-mission and room temperatures. The back-gate bias voltages are constrained by an exemplary 3V oxide reliability limit and thus may be extended (for reduced mission-mode threshold voltage and power consumption) in alternative embodiments. Also, reflecting on FIGS. 4 and 5, where the LVT FDSOI back-gate bias voltage and corresponding threshold voltage are constrained (e.g., by oxide reliability limit) at a point that meets the target mission-mode leakage-current for low-leakage digital circuitry, separate circuit implementation and biasing of low-leakage digital circuitry may be avoided. For example, if the low-leakage threshold/leakage ratio target is 8 decades ($\log_{10}(I_{V_t}/I_{0V})=8$) and the LVT FD-SOI subthreshold slope at mission temperature is 25 mV/decade, then a mission-temperature threshold voltage at or above 200 mV will be sufficient to achieve the low-leakage digital performance. That is, the low-leakage characteristic will inhere in the general digital circuit implementation by virtue of a mission-temperature threshold voltage required (by oxide reliability limit or other constraint) to be greater than 200 mV. In those cases, the multi-threshold integrated circuit implementation shown in FIG. 3A simplifies to an embodiment that includes only the general digital and high-speed circuit regions (181, 183), obviating RVT FD-SOI implementation of low-leakage digital circuitry 185. In such an embodiment, any RVT FDSOI-specific bias voltages, supply voltages and/or dedicated inputs (or generation circuitry) for same may be omitted.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, temperatures, temperature ranges, bias voltages, materials, material arrangements and the like can be different from those described above in alternative embodiments. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operating an integrated-circuit (IC) component, the method comprising:
    applying a first bias voltage to a first substrate region disposed adjacent a first plurality of transistors to effect a leakage current for the first plurality of transistors below a nominal leakage current; and
    applying a second bias voltage, different from the first bias voltage, to a second substrate region disposed adjacent a second plurality of transistors to effect a switching speed for the second plurality of transistors greater than a nominal switching speed.

2. The method of claim 1 wherein applying the first and second bias voltages comprises applying the first and second bias voltages during operation of the IC component at a cryogenic temperature.

3. The method of claim 2 further comprising applying third and fourth voltages to the first and second substrate regions, respectively, during operation of the IC component at a test environment temperature substantially higher than the cryogenic temperature.

4. The method of claim 2 further comprising generating the first, second, third and fourth bias voltages and supplying the first, second, third and fourth bias voltages to a selector circuit that outputs, to the first and second substrate regions, either the first and second bias voltages or the third and fourth bias voltages according to whether a control signal is in a first state or a second state.

5. The method of claim 4 further comprising receiving the control signal from a source external to the IC component.

6. The method of claim 4 further comprising generating the control signal in either the first state or the second state according to whether a temperature detection circuit of the IC component detects a temperature below or above a threshold temperature, respectively.

7. The method of claim 6 wherein the threshold temperature corresponds to a temperature not higher than 100 Kelvin.

8. The method of claim 1 wherein the first plurality of transistors comprises a first plurality of N-type metal-oxide-semiconductor (NMOS) transistors and the second plurality of transistors comprises a second plurality of NMOS transistors, the method further comprising:
    applying a third bias voltage to a third substrate region disposed adjacent a first plurality of P-type metal-oxide-semiconductor (PMOS) transistors to effect a leakage current for the first plurality of PMOS transistors below the nominal leakage current; and
    applying a fourth bias voltage to a fourth substrate region disposed adjacent a second plurality of PMOS transistors to effect a switching speed for the second plurality of PMOS transistors greater than the nominal switching speed.

9. The method of claim 8 wherein applying the first, second, third and fourth bias voltages comprises applying the first, second, third and fourth bias voltages during operation of the IC component at a cryogenic temperature, the method further comprising applying fifth, sixth, seventh and eighth bias voltages to the first, second, third and fourth substrate regions, respectively, during operation of the IC component at a test environment temperature substantially higher than the cryogenic temperature.

10. The method of claim 1 wherein the first and second substrate regions and the first and second pluralities of transistors are implemented in a low-threshold-voltage silicon-on-insulator process in which the first and second substrate regions are separated from the first and second pluralities of transistors, respectively, by a buried oxide.

11. The method of claim 1 further comprising applying a third bias voltage, different from the first and second bias voltages, to a third substrate region disposed adjacent a third plurality of transistors.

12. An integrated-circuit (IC) component comprising:
    first and second pluralities of transistors;
    first and second substrate regions disposed adjacent the first plurality of transistors and the second plurality of transistors, respectively; and
    biasing circuitry to apply (i) a first bias voltage to the first substrate region to effect a leakage current for the first plurality of transistors below a nominal leakage current and (ii) a second bias voltage, different from the first bias voltage, to the second substrate region to effect a switching speed for the second plurality of transistors greater than a nominal switching speed.

13. The IC component of claim 12 wherein the biasing circuitry to apply the first and second bias voltages comprises circuitry to apply the first and second bias voltages to the first and second substrate regions during operation of the IC component at a cryogenic temperature and to apply third and fourth voltages to the first and second substrate regions, respectively, during operation of the IC component at a test environment temperature substantially higher than the cryogenic temperature.

14. The IC component of claim 13 wherein the biasing circuitry comprises a bias voltage generator to generate the first, second, third and fourth bias voltages, and wherein the circuitry to apply the first and second bias voltages to the first and second substrate regions during operation of the IC component at a cryogenic temperature and to apply the third and fourth voltages to the first and second substrate regions during operation of the IC component at a test environment temperature substantially higher than the cryogenic temperature comprises selector circuitry coupled to receive the first, second, third and fourth bias voltages from the bias voltage generator and to output, to the first and second substrate regions, either the first and second bias voltages or the third and fourth bias voltages according to whether a control signal is in a first state or a second state.

15. The IC component of claim 14 further comprising a temperature detection circuit to generate the control signal in either the first state or the second state according to detected temperature.

16. The IC component of claim 12 wherein the first plurality of transistors comprises a first plurality of N-type metal-oxide-semiconductor (NMOS) transistors and the second plurality of transistors comprises a second plurality of NMOS transistors, and wherein the IC component further comprises:
   first and second pluralities of P-type metal-oxide-semiconductor (PMOS) transistors;
   third and fourth substrate regions disposed adjacent the first plurality of PMOS transistors and the second plurality of PMOS transistors, respectively; and
   wherein the biasing circuitry is further to apply:
      a third bias voltage to the third substrate region to effect a leakage current for the first plurality of PMOS transistors below the nominal leakage current; and
      a fourth bias voltage to the fourth substrate region to effect a switching speed for the second plurality of PMOS transistors greater than the nominal switching speed.

17. The IC component of claim 16 wherein the temperature detection circuit generates the control signal in either the first state or the second state according to whether the detected temperature exceeds a temperature threshold, the temperature threshold corresponding to a temperature not higher than 100 Kelvin.

18. The IC component of claim 12 wherein the first and second substrate regions comprise doped wells separated from the first and second pluralities of transistors, respectively, by a buried oxide within a low-threshold-voltage silicon-on-insulator substrate.

19. The IC component of claim 18 wherein the biasing circuitry to apply the first, second, third and fourth bias voltages comprises circuitry to apply the first, second, third and fourth bias voltages during operation of the IC component at a cryogenic temperature, and to apply fifth, sixth, seventh and eighth bias voltages to the first, second, third and fourth substrate regions, respectively, during operation of the IC component at a test environment temperature substantially higher than the cryogenic temperature.

20. An integrated-circuit (IC) component comprising:
   first and second pluralities of transistors;
   first and second substrate regions disposed adjacent the first plurality of transistors and the second plurality of transistors, respectively; and
   means for applying (i) a first bias voltage to the first substrate region to effect a leakage current for the first plurality of transistors below a nominal leakage current and (ii) a second bias voltage, different from the first bias voltage, to the second substrate region to effect a switching speed for the second plurality of transistors greater than a nominal switching speed.

* * * * *